United States Patent
Miyata et al.

(10) Patent No.: US 8,116,894 B2
(45) Date of Patent: Feb. 14, 2012

(54) CHEMICAL MECHANICAL POLISHING METHOD AND CHEMICAL MECHANICAL POLISHING DEVICE

(75) Inventors: Masanori Miyata, Hyogo (JP); Taro Usami, Hyogo (JP); Koichi Sogawa, Hyogo (JP); Kenji Nishihara, Hyogo (JP); Tadao Uehara, Hyogo (JP); Shisyo Chin, Hyogo (JP); Hiroaki Teratani, Hyogo (JP); Akinori Suzuki, Hyogo (JP); Yuuichi Kohno, Hyogo (JP); Tetsuya Okada, Hyogo (JP); Tohru Haruki, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 423 days.

(21) Appl. No.: 12/340,208

(22) Filed: Dec. 19, 2008

(65) Prior Publication Data

US 2009/0170323 A1   Jul. 2, 2009

(30) Foreign Application Priority Data

Dec. 27, 2007   (JP) ................................. 2007-335772

(51) Int. Cl.
   *G06F 19/00*   (2006.01)
(52) U.S. Cl. ........ 700/121; 438/692; 438/759; 257/632; 257/758
(58) Field of Classification Search .................. 438/692, 438/759; 257/632, 758; 700/121
See application file for complete search history.

(56) References Cited

U.S. PATENT DOCUMENTS

| | | | | |
|---|---|---|---|---|
| 5,643,837 A | * | 7/1997 | Hayashi | 438/693 |
| 5,688,364 A | * | 11/1997 | Sato | 438/693 |
| 5,688,720 A | * | 11/1997 | Hayashi | 438/633 |
| 5,847,466 A | * | 12/1998 | Ito et al. | 257/775 |
| 5,929,528 A | * | 7/1999 | Kinugawa | 257/776 |
| 6,147,001 A | * | 11/2000 | Kimura et al. | 438/692 |
| 6,160,297 A | * | 12/2000 | Shimizu et al. | 257/390 |
| 6,191,007 B1 | * | 2/2001 | Matsui et al. | 438/459 |
| 6,396,146 B2 | * | 5/2002 | Nakayama | 257/758 |
| 7,629,092 B2 | * | 12/2009 | Yamada | 430/30 |
| 2002/0000663 A1 | * | 1/2002 | Nakayama | 257/758 |
| 2003/0173671 A1 | * | 9/2003 | Hironaga et al. | 257/758 |
| 2005/0280120 A1 | * | 12/2005 | Tomita | 257/620 |
| 2007/0070314 A1 | * | 3/2007 | Yamada | 355/53 |
| 2008/0197456 A1 | * | 8/2008 | Nakamura et al. | 257/632 |

FOREIGN PATENT DOCUMENTS

| | | |
|---|---|---|
| JP | 2005-166953 | 6/2005 |
| JP | 3745951 | 12/2005 |
| JP | 2007-046085 | 2/2007 |

\* cited by examiner

*Primary Examiner* — Albert Decady
*Assistant Examiner* — Anthony Whittington
(74) *Attorney, Agent, or Firm* — Dickstein Shapiro LLP

(57) ABSTRACT

A chemical mechanical polishing method including a step of forming a plurality of interlayer insulating films so as to coat a plurality of projecting patterns, at least one of the plurality of projecting patterns being formed on each of a plurality of substrates, whereby the plurality of projection patterns have different area ratios R with respect to the corresponding substrates, and performing a flattening process on the interlayer insulating films before linear approximation; a step of obtaining a linear approximation formula $R=aT+b$ expressing a relationship between the area ratio R and a polishing time T, where $R1, R2, R3, \ldots, Rx$ represent the area ratio R of each of the projecting patterns with respect to the corresponding substrates, and $T1, T2, T3, \ldots, Tx$ represent the polishing time T required for achieving a target film thickness when performing the flattening process by polishing each of the interlayer insulating films coating the projecting patterns; and a step of calculating, with the use of a formula $T=(R-b)/a$, the polishing time T for the interlayer insulating films coating the projecting patterns having the area ratio R.

4 Claims, 3 Drawing Sheets

CHEMICAL MECHANICAL POLISHING METHOD AND CHEMICAL MECHANICAL POLISHING DEVICE

BACKGROUND OF THE INVENTION

1. Field of the Invention

The present invention relates to a chemical mechanical polishing method and a chemical mechanical polishing device for performing a flattening process on an interlayer insulating film formed by coating a projecting pattern on a substrate.

2. Description of the Related Art

Chemical mechanical polishing (hereinafter, "CMP") is a typical method for flattening an interlayer insulating film formed on the surface of a semiconductor wafer. However, there are problems accompanying the flattening method performed by CMP. That is, to achieve the target thickness of the interlayer insulating film, the required polishing time varies depending on the following factor. Specifically, the polishing time varies depending on the ratio of the projecting base pattern forming a step on the surface of the interlayer insulating film, with respect to the entire substrate.

An example is illustrated in FIG. 5. A base film 1 is a wiring film including an aluminum material film, a polysilicon film, and an amorphous silicon film. A projecting pattern 3 is formed on the base film 1. An interlayer insulating film 5 is formed on the base film 1 in such a manner as to coat the projecting pattern 3. A projecting part 7 is formed on the surface of the interlayer insulating film 5 due to the projecting pattern 3. In order to polish the interlayer insulating film 5 to attain a desirable film thickness A, the time required for polishing the interlayer insulating film 5 tends to vary depending on the ratio of the size of the projecting pattern 3 with respect to the size of the wafer surface.

Thus, the following procedure has been required in the conventional technology. Specifically, to polish an interlayer insulating film which is formed by coating a projecting pattern, a sample wafer is used for determining the polishing time beforehand. The polishing process is performed on this sample wafer for an appropriate length of time. Then, the thickness of the interlayer insulating film is measured, to determine the desirable polishing time. Subsequently, the wafers in the batch are polished for the determined polishing time.

However, the above method requires a sample wafer for determining the polishing time, and also requires the procedure of determining the desirable polishing time with the use of this sample wafer. Thus, extra steps are necessary for performing this method.

Patent document 1 discloses a chemical mechanical polishing method in an attempt to solve this problem. This method includes a step of defining a formula expressing the relationship between the polishing rate for polishing the interlayer insulating film formed on the wafer and coating the projecting pattern, and the area of the projecting pattern on the wafer. Then, the desirable polishing time is calculated with the use of this formula and the polishing rate for polishing an interlayer insulating film without a projecting pattern.

Patent Document 1: Japanese Patent No. 3745951

SUMMARY OF THE INVENTION

The present invention provides a chemical mechanical polishing method and a chemical mechanical polishing device in which one or more of the above-described disadvantages are eliminated.

A preferred embodiment of the present invention provides a chemical mechanical polishing method and a chemical mechanical polishing device capable of calculating the polishing time required for achieving the target interlayer insulating film thickness without the need to determine the condition of the polishing time with the use of a sample wafer.

According to an aspect of the present invention, there is provided a chemical mechanical polishing method for performing a flattening process on an interlayer insulating film, including a step of forming a plurality of the interlayer insulating films so as to coat a plurality of projecting patterns, at least one of the plurality of projecting patterns being formed on each of a plurality of substrates, whereby the plurality of projection patterns have different area ratios R with respect to the corresponding substrates, and performing the flattening process on the interlayer insulating films before linear approximation; a step of obtaining a linear approximation formula $R=aT+b$ expressing a relationship between the area ratio R and a polishing time T, where $R1, R2, R3, \ldots, Rx$ represent the area ratio R of each of the projecting patterns with respect to the corresponding substrates, and $T1, T2, T3, \ldots, Tx$ represent the polishing time T required for achieving a target film thickness when performing the flattening process by polishing each of the interlayer insulating films coating the projecting patterns; and a step of calculating, with the use of a formula $T=(R-b)/a$, the polishing time T for the interlayer insulating films coating the projecting patterns having the area ratio R.

According to one embodiment of the present invention, a chemical mechanical polishing method and a chemical mechanical polishing device are provided, which are capable of calculating the polishing time required for achieving the target interlayer insulating film thickness without the need to determine the condition of the polishing time with the use of a sample wafer.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given, with reference to the accompanying drawings, of embodiments of the present invention.

Figure 1:
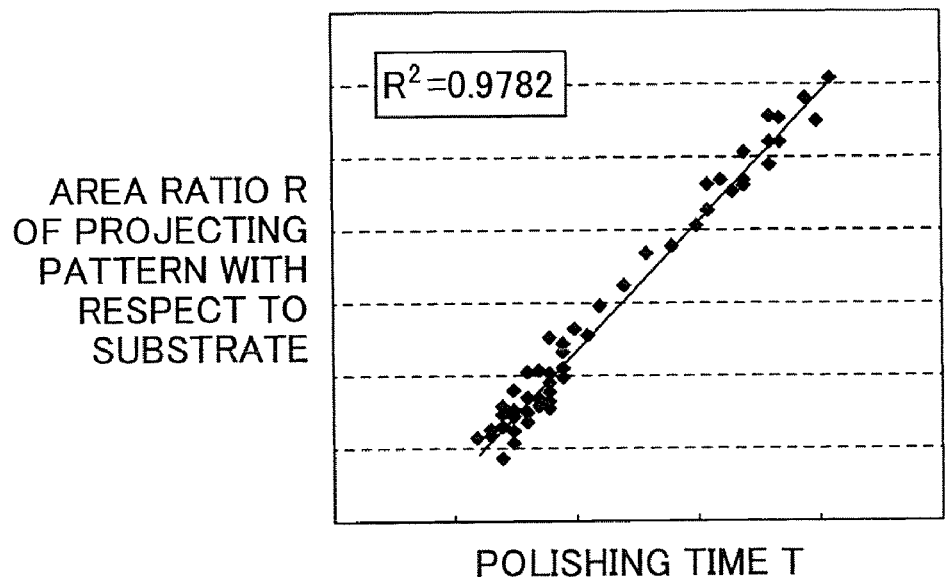
FIG. 1 illustrates the relationship between an area ratio R and a polishing time T for plural substrates each having a projecting pattern formed thereon, whereby the projecting patterns on the plural substrates have different area ratios R from each other, the polishing time T is the time required for achieving the target film thickness by polishing the interlayer insulating film which is coating the projecting pattern, the vertical axis indicates the area ratio R of the projecting pattern with respect to the substrate, and the horizontal axis indicates the polishing time T required for achieving the target film thickness.

FIG. 1 illustrates the relationship between an area ratio R and a polishing time T for plural substrates, each having a projecting pattern formed thereon. The area ratio R is the ratio of the projecting pattern with respect to the substrate. The projecting patterns on the plural substrates have different area ratios R from each other. The polishing time T is the time required for achieving the target film thickness by polishing the interlayer insulating film which is formed on the substrate and coating the projecting pattern. The vertical axis indicates the area ratio R of the projecting pattern with respect to the substrate, and the horizontal axis indicates the polishing time T required for achieving the target film thickness. The area ratio R is obtained by dividing the area of the projecting pattern by the area of the substrate. The polishing time T required for achieving the target film thickness is obtained by actually performing a polishing process on each of the plural substrates with projecting patterns having different area ratios R with respect to the corresponding substrates, and then measuring the interlayer insulating film thickness.

The data shown in FIG. 1 indicates that the area ratio R and the polishing time T have a proportional relationship. As the area ratio R of the projecting pattern with respect to the substrate becomes larger, the polishing time T required for achieving the target interlayer insulating film thickness becomes longer.

Accordingly, by performing linear approximation on the data shown in FIG. 1, a linear approximation formula R=aT+b can be obtained. When a polishing process is to be performed on an interlayer insulating film that is coating a projecting pattern of a different layout, this formula R=aT+b can be used for calculating the polishing time T required for achieving a target thickness for this interlayer insulating film. Specifically, the area ratio R of this projecting pattern with respect to the entire chip is calculated, and this area ratio R is assigned to the formula R=aT+b.

Figure 2:
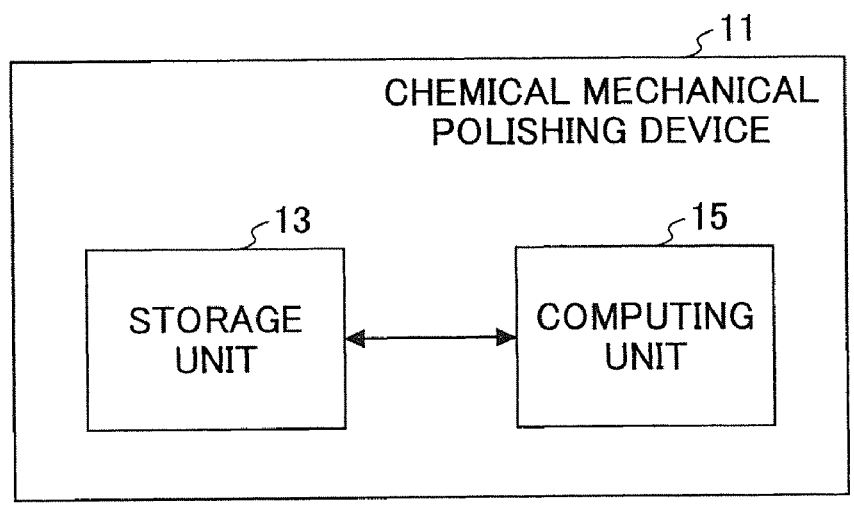
FIG. 2 is a schematic block diagram of an example of a chemical mechanical polishing device.

FIG. 2 is a schematic block diagram of an example of a chemical mechanical polishing device.

A chemical mechanical polishing device 11 includes a storage unit 13 and a computing unit 15. The storage unit 13 stores constants a, b of the linear approximation formula R=aT+b expressing the relationship between the area ratio R and the time T obtained by the chemical mechanical polishing method according to an embodiment of the present invention. The computing unit 15 reads the constants a, b from the storage unit 13. Then, with the use of a formula T=(R−b)/a, the computing unit 15 calculates the polishing time T for the interlayer insulating film which is formed on a substrate and coating a projecting pattern having an area ratio R.

When the computing unit 15 receives an instruction to calculate the area ratio R of the projecting pattern with respect to the substrate to be polished and the polishing time T, the computing unit 15 reads the constants a, b from the storage unit 13, and calculates the polishing time T with the use of the formula T=(R−b)/a.

Accordingly, it is possible to calculate the polishing time T required for achieving the target interlayer insulating film thickness, without the need to determine the condition of the polishing time with the use of a sample wafer.

Figure 6:
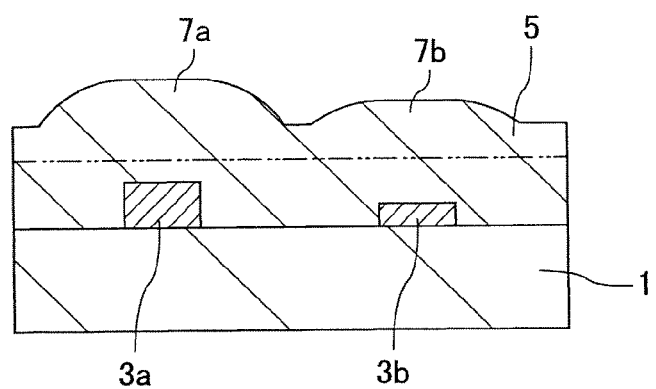
FIG. 6 is a schematic cross-sectional view of another example of a polishing target substrate before undergoing the polishing process.

Furthermore, as shown in FIG. 6, when a single layer includes projecting patterns 3a, 3b having different thicknesses, a corrected area ratio R can be obtained with the formula of R=D1×r1+D2×r2+D3×r3+ . . . +Dy×ry, where the thicknesses of the projecting patterns are divided into regions expressed as D1, D2, D3 . . . Dy, and an area ratio r of each projecting pattern with respect to the substrate is expressed as r1, r2, r3, . . . , ry. Then, the obtained area ratio R can be assigned to the linear approximation formula R=aT+b.

For example, it is assumed that the projecting patterns 3a, 3b shown in FIG. 6 have the following specifications: the projecting pattern 3a has a thickness of 400 nm; the projecting pattern 3b has a thickness of 200 nm; the area ratio r of the projecting pattern 3a with respect to the substrate is 30%; and the area ratio r of the projecting pattern 3b with respect to the substrate is 30%. Then, the corrected area ratio R can be calculated as follows.

$$R=400[\text{nm}]\times 30[\%]+200[\text{nm}]\times 30[\%]=18000$$
[nm %[nm % is an arbitrary unit]]

When a polishing process is performed on an interlayer insulating film coating projecting patterns having different layouts, the area ratio R of this projecting pattern with respect to the entire chip is calculated with the use of the formula R=D1×r1+D2×r2+D3×r3+ . . . +Dy×ry. By assigning the obtained area ratio R to the linear approximation formula R=aT+b, it is possible to calculate the polishing time T required to achieve the target film thickness for the interlayer insulating film coating the projecting patterns. Accordingly, even when a single layer includes projecting patterns with different thicknesses, the polishing time T can be accurately calculated.

Figure 3:
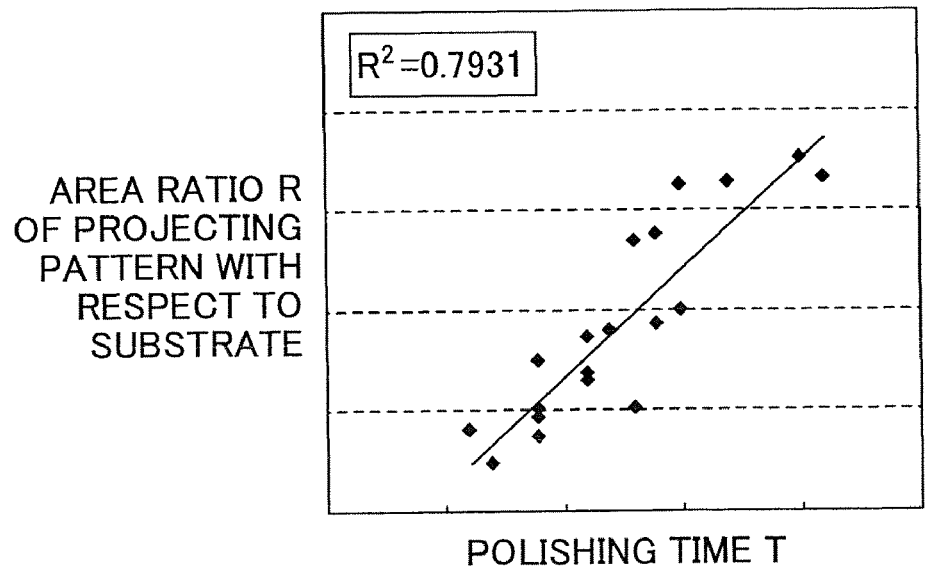
FIG. 3 shows data obtained by linear approximation without dividing the regions of the projecting patterns having different thicknesses in a single layer, whereby the data indicates the relationship between an area ratio R and a polishing time T for plural substrates each having a projecting pattern formed thereon, the projecting patterns on the plural substrates have different area ratios R from each other, the polishing time T is the time required for achieving the target film thickness by polishing the interlayer insulating film which is coating the projecting pattern.
Figure 4:
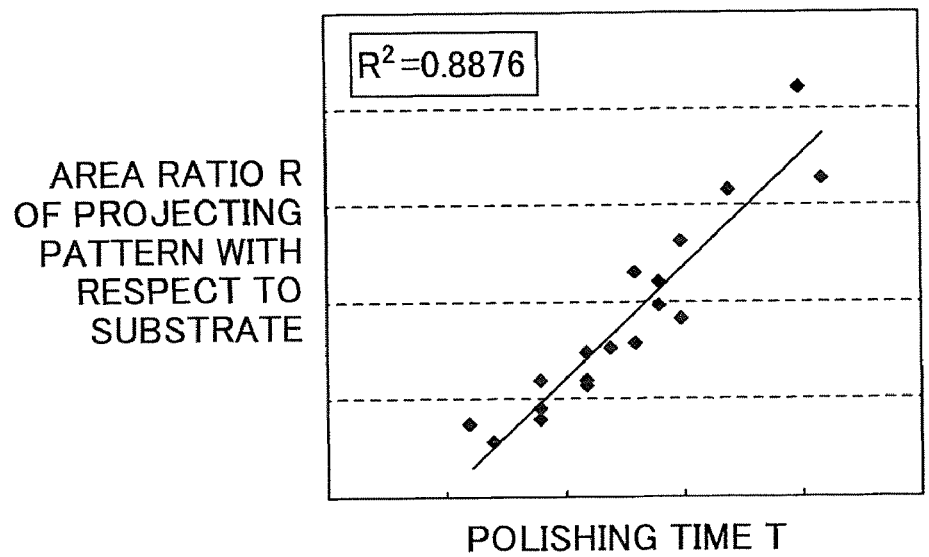
FIG. 4 shows data obtained by linear approximation upon dividing the regions of the projecting patterns having different thicknesses in a single layer, which is based on the same sample as that of FIG. 3.
Figure 5:
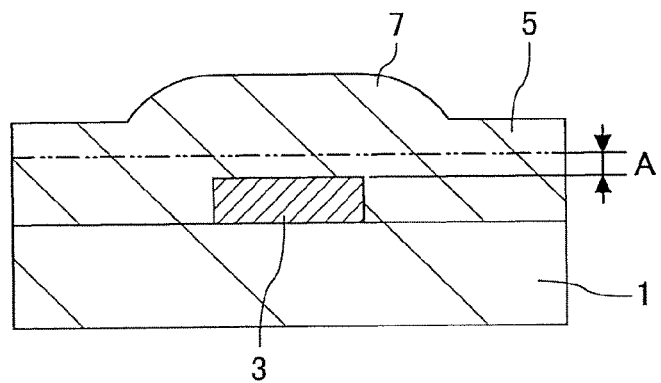
FIG. 5 is a schematic cross-sectional view of an example of a polishing target substrate before undergoing the polishing process.

FIGS. 3 and 4 illustrate the relationship between an area ratio R and a polishing time T for plural substrates with projecting patterns having different area ratios R with respect to the corresponding substrates. The polishing time T is the time required for achieving the target film thickness by polishing the interlayer insulating film coating the projecting pattern. FIG. 3 shows data obtained by linear approximation without dividing the regions of the projecting patterns having different thicknesses in a single layer, and FIG. 4 shows data obtained by linear approximation upon dividing the regions of the projecting patterns having different thicknesses in a single layer. The data of FIGS. 3 and 4 is based on the same raw data.

Comparing the data obtained upon dividing the regions of the projecting patterns having different thicknesses in a single layer (FIG. 4) and the data obtained without dividing the regions (FIG. 3), the correlation $R^2$ of the linear approximation in FIG. 4 is closer to one, compared to that of FIG. 3. Thus, the linear approximation can be obtained more precisely by performing the correction upon dividing the regions. Accordingly, when a polishing process is to be performed on an interlayer insulating film that is coating projecting patterns of a different layout, the polishing time T required for achieving a target interlayer insulating film thickness is calculated with the formula T=(R−b)/a based on the linear approximation formula R=aT+b obtained from the data of FIG. 4. Thus, compared to the case of using the linear approximation formula obtained from the data of FIG. 3, the polishing time T can be calculated more accurately. Furthermore, for projecting patterns having a different layout, the area ratio R is preferably calculated using the formula of $R=D1 \times r1+D2 \times r2+D3 \times r3+ \ldots +Dy \times ry$.

Furthermore, for example, when SOG (Spin On Glass) is applied to the interlayer insulating film, the interlayer insulating film formed on the projecting patterns will have different film thicknesses according to the differences in the widths and the inter-pattern spaces of the projecting patterns. For example, as shown in FIG. 7, a projecting part 7c of the interlayer insulating film 5, which is formed on a projecting pattern 3c having a relatively short width, has a smaller film thickness than that of a projecting part 7d of the interlayer insulating film 5, which is formed on a projecting pattern 3d having a relatively long width.

In this case, the regions of the projecting patterns in a single layer are divided based on the pattern widths and the inter-pattern spaces, and a corrected area ratio R can be obtained with the formula of $R=M1 \times \gamma 1+M2 \times \gamma 2+M3 \times \gamma 3+ \ldots +Mz \times \gamma z$, where the film thickness M of the interlayer insulating film in each region is expressed as M1, M2, M3, ..., Mz using as a reference the film thickness of the interlayer insulating film in one of the regions, and an area ratio γ of each projecting pattern with respect to the substrate in each region is expressed as γ1, γ2, γ3, ..., γz. Then, the obtained area ratio R can be assigned to the linear approximation formula R=aT+b.

Figure 7:
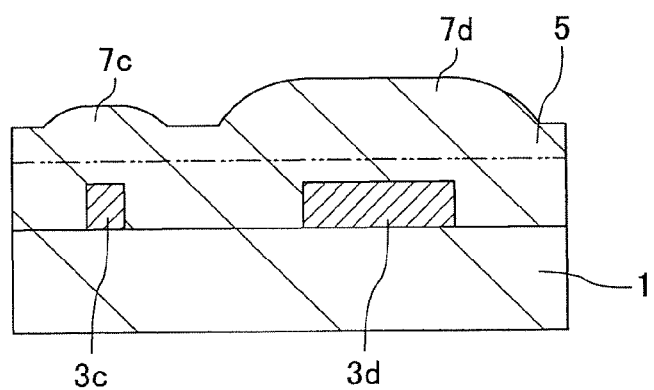
FIG. 7 is a schematic cross-sectional view of yet another example of a polishing target substrate before undergoing the polishing process.

For example, it is assumed that the projecting patterns 3c, 3d shown in FIG. 7 have the following specifications: the projecting pattern 3c has a width of less than 10 μm; the film thickness of the interlayer insulating film 5 at the projecting part 7c above the projecting pattern 3c is 1200 nm; the projecting pattern 3d has a width of more than or equal to 10 μm; the film thickness of the interlayer insulating film 5 at the projecting part 7d above the projecting pattern 3d is 1500 nm; the area ratio γ of the projecting pattern 3c with respect to the substrate is 30%; and the area ratio γ of the projecting pattern 3d with respect to the substrate is 30%. Then, the corrected area ratio R can be calculated as follows.

$$R=1200[nm] \times 30[\%]+1500[nm] \times 30[\%]=81000$$
$$[nm \%[nm \% \text{ is an arbitrary unit}]]$$

In the above example, the regions of the projecting patterns are divided based on only the widths of the projecting patterns; however, the regions of the projecting patterns can be divided based on both the widths and the inter-pattern spaces of the projecting patterns.

When a polishing process is performed on an interlayer insulating film coating projecting patterns having a different layout, the area ratio R of these projecting patterns with respect to the entire chip is calculated with the use of the formula $R=M1 \times \gamma 1+M2 \times \gamma 2+M3 \times \gamma 3+ \ldots +Mz \times \gamma z$. By assigning the obtained area ratio R to the linear approximation formula R=aT+b, it is possible to calculate the polishing time T required to achieve the target film thickness for the interlayer insulating film coating the projecting patterns. Accordingly, the polishing time T required to achieve the target interlayer insulating film thickness can be accurately calculated. This is particularly effective in a case of applying SOG to the interlayer insulating film.

According to an aspect of the present invention, there is provided a chemical mechanical polishing method for performing a flattening process on an interlayer insulating film, including a step of forming a plurality of the interlayer insulating films so as to coat a plurality of projecting patterns, at least one of the plurality of projecting patterns being formed on each of a plurality of substrates, whereby the plurality of projection patterns have different area ratios R with respect to the corresponding substrates, and performing the flattening process on the interlayer insulating films before linear approximation; a step of obtaining a linear approximation formula R=aT+b expressing a relationship between the area ratio R and a polishing time T, where R1, R2, R3, ..., Rx represent the area ratio R of each of the projecting patterns with respect to the corresponding substrates, and T1, T2, T3, ..., Tx represent the polishing time T required for achieving a target film thickness when performing the flattening process by polishing each of the interlayer insulating films coating the projecting patterns; and a step of calculating, with the use of a formula T=(R−b)/a, the polishing time T for the interlayer insulating films coating the projecting patterns having the area ratio R. In this case, x is two or more.

According to an aspect of the present invention, there is provided a chemical mechanical polishing device for implementing the above chemical mechanical polishing, including a storing unit configured to store constants a, b obtained with the linear approximation formula R=aT+b; and a computing unit configured to read the constants a, b from the storing unit, and calculating, with the use of the formula T=(R−b)/a, the polishing time T for the interlayer insulating films coating the projecting patterns having the area ratio R.

Interlayer insulating films were formed so as to coat projecting patterns, at least one of the projecting patterns being formed on each of the substrates, whereby the projection patterns have different area ratios R with respect to the corresponding substrates. The polishing process was actually performed on the interlayer insulating films. The thicknesses of the interlayer insulating films were measured after the polishing process to obtain the polishing time required for achieving the target thickness. For example, a chart was depicted, with the vertical axis (Y axis) indicating the area ratio of a layer forming a step on a chip with respect to the entire chip, and the horizontal axis (X axis) indicating the polishing time required for achieving the target thickness of the interlayer insulating film, and it was found that the area ratio and the required polishing time have a proportional relationship. Accordingly, by performing linear approximation on the points depicted in this chart, a linear approximation formula R=aT+b was obtained. When a polishing process is to be performed on an interlayer insulating film that is coating a projecting pattern of a different layout, the area ratio of this projecting pattern with respect to the entire substrate is calculated, and this area ratio is assigned to a linear formula T=(R−b)/a, to obtain the polishing time T required for achieving the target thickness of the interlayer insulating film.

Accordingly, with the chemical mechanical polishing method and the chemical mechanical polishing device according to an aspect of the present invention, the polishing time required for achieving the target interlayer insulating film thickness can be calculated without the need to determine the condition of the polishing time with the use of a sample wafer.

Incidentally, as shown in FIG. 6, when a single layer includes projecting patterns 3a, 3b having different thicknesses, projecting parts 7a, 7b formed on the interlayer insulating film 5 will have different thicknesses.

Thus, the chemical mechanical polishing method according to an aspect of the present invention can be configured such that the projecting patterns having different thicknesses are included in each of the interlayer insulating films; D1, D2, D3, ..., Dy represent a thickness D of each of the projecting patterns; and r1, r2, r3, ..., ry represent an area ratio r of each of the projecting patterns having different thicknesses with respect to the corresponding substrate; and the area ratio R is calculated with the use of a formula R=D1×r1+D2×r2+D3×r3+ ... +Dy×ry. In this case, y is two or more.

Accordingly, the polishing time required to achieve the target interlayer insulating film thickness can be accurately calculated, even when projecting patterns having different thicknesses are included in each of the interlayer insulating films.

Furthermore, for example, when SOG (Spin On Glass) is applied to the interlayer insulating film, the interlayer insulating film formed on the projecting patterns will have different film thicknesses according to the differences in the widths and the inter-pattern spaces of the projecting patterns. For example, as shown in FIG. 7, a projecting part 7c of the interlayer insulating film 5, which is formed on a projecting pattern 3c having a relatively short width, has a smaller film thickness than that of a projecting part 7d of the interlayer insulating film 5, which is formed on a projecting pattern 3d having a relatively long width.

Thus, the chemical mechanical polishing method according to an aspect of the present invention can be configured such that the projecting patterns included in each of the interlayer insulating films are divided into regions based on pattern widths and inter-pattern spaces; M1, M2, M3, ..., Mz represent a film thickness M of the interlayer insulating films above each of the regions; and γ1, γ2, γ3, ..., γz represent an area ratio γ of the projecting patterns in each of the regions with respect to the corresponding substrates; and the area ratio R is calculated with the use of a formula R=M1×γ1+M2×γ2+M3×γ3+ ... +Mz×γz. In this case, z is two or more.

Accordingly, the polishing time required to achieve the target interlayer insulating film thickness can be accurately calculated. This is particularly effective in a case of applying SOG to the interlayer insulating film.

The present invention is not limited to the specifically disclosed embodiment, and variations and modifications may be made without departing from the scope of the present invention.

The present application is based on Japanese Priority Patent Application No. 2007-335772, filed on Dec. 27, 2007, the entire contents of which are hereby incorporated herein by reference.

What is claimed is:

1. A chemical mechanical polishing method for performing a flattening process on an interlayer insulating film, comprising:
   a step of forming a plurality of interlayer insulating films so as to coat a plurality of sets of projecting patterns, at least one of the plurality of sets of projecting patterns being formed on each of a plurality of substrates, whereby each of the plurality of sets of projecting patterns has a different area ratio R with respect to a respective one of the plurality of substrates, and performing a flattening process by polishing each of the interlayer insulating films coating the plurality of sets of projecting patterns;
   subsequent to performing the flattening process by polishing each of the interlayer insulating films, a step of obtaining a linear approximation formula R=aT+b expressing a relationship between the area ratio R and a polishing time T, where R1, R2, R3, ..., Rx represent the area ratio R of respective ones of the plurality of sets of projecting patterns with respect to the respective one of the plurality of substrates, and T1, T2, T3, ..., Tx represent the respective polishing times T required for achieving a target film thickness by the polishing; and
   a step of calculating, with the use of a formula T=(R−b)/a, values of a and b being obtained from the step of obtaining the linear approximation formula, the polishing time T for a particular interlayer insulating film coating a particular set of projecting patterns having a particular area ratio R,
   wherein each of the plurality of sets of projecting patterns has a plurality of individual projecting patterns having different thicknesses with respect to the respective one of the plurality of substrates; D1, D2, D3, ..., Dy represent a thickness D of each one of the individual projecting patterns of a set of projecting patterns; and r1, r2, r3, ..., ry represent an area ratio r of each one of the individual projecting patterns of the set of projecting patterns, and
   wherein the particular area ratio R of the particular set of projecting patterns is calculated with the use of a formula R=D1×r1+D2×r2+D3×r3+ ... +Dy×ry.

2. A chemical mechanical polishing method for performing a flattening process on an interlayer insulating film, comprising:
   a step of forming a plurality of interlayer insulating films so as to coat a plurality of sets of projecting patterns, at least one of the plurality of sets of projecting patterns being formed on each of a plurality of substrates, whereby each of the plurality of sets of projecting patterns has a different area ratio R with respect to a respective one of the plurality of substrates, and performing a flattening process by polishing each of the interlayer insulating films coating the plurality of sets of projecting patterns;
   subsequent to performing the flattening process by polishing each of the interlayer insulating films, a step of obtaining a linear approximation formula R=aT+b expressing a relationship between the area ratio R and a polishing time T, where R1, R2, R3, ..., Rx represent the area ratio R of respective ones of the plurality of sets of projecting patterns with respect to the respective one of the plurality of substrates, and T1, T2, T3, ..., Tx represent the respective polishing times T required for achieving a target film thickness by the polishing; and
   a step of calculating, with the use of a formula T=(R−b)/a, values of a and b being obtained from the step of obtaining the linear approximation formula, the polishing time T for a particular interlayer insulating film coating a particular set of projecting patterns having a particular area ratio R,
   wherein each of the plurality of sets of projecting patterns has a plurality of individual projecting patterns divided into a plurality of regions based on pattern widths and inter-pattern spaces of the individual projecting patterns; M1, M2, M3, ..., Mz represent a film thickness M of the interlayer insulating films above each one of the regions; and γ1, γ2, γ3, ..., γz represent an area ratio γ of the projecting patterns in each one of the regions with respect to the corresponding substrates; and
   wherein the particular area ratio R of the particular set of projecting patterns is calculated with the use of a formula R=M1×γ1+M2×γ2+M3×γ3+ ... +Mz×γz.

3. A chemical mechanical polishing device for implementing the chemical mechanical polishing method according to claim 1, comprising:
   a storing unit configured to store the values of constants a, b obtained with the linear approximation formula R=aT+b; and
   a computing unit configured to read the values of constants a, b from the storing unit, and calculating, with the use of the formula T=(R−b)/a, the polishing time T for the interlayer insulating film coating the particular set of projecting patterns having the particular area ratio R.

4. A chemical mechanical polishing device for implementing the chemical mechanical polishing method according to claim 2, comprising:
 a storing unit configured to store the values of constants a, b obtained with the linear approximation formula R=aT+b; and a computing unit configured to read the values of constants a, b from the storing unit, and calculating, with the use of the formula T=(R−b)/a, the polishing time T for the interlayer insulating film coating the particular set of projecting patterns having the particular area ratio R.

* * * * *